United States Patent
Morishita et al.

(10) Patent No.: US 9,171,947 B2
(45) Date of Patent: *Oct. 27, 2015

(54) NITRIDE SEMICONDUCTOR DEVICE (71) Applicant: SHARP KABUSHIKI KAISHA, Osaka-shi, Osaka (JP)

(72) Inventors: Satoshi Morishita, Osaka (JP); Koichiro Fujita, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/372,970

(22) PCT Filed: Feb. 14, 2013

(86) PCT No.: PCT/JP2013/053549
§ 371 (c)(1), (2) Date: Jul. 17, 2014

(87) PCT Pub. No.: WO2013/122154
PCT Pub. Date: Aug. 22, 2013

(65) Prior Publication Data
US 2015/0001586 A1    Jan. 1, 2015

(30) Foreign Application Priority Data

Feb. 15, 2012  (JP) ................................. 2012-030690

(51) Int. Cl.
*H01L 29/66* (2006.01)
*H01L 29/778* (2006.01)
*H01L 29/20* (2006.01)
*H01L 29/08* (2006.01)

(52) U.S. Cl.
CPC ........ *H01L 29/7786* (2013.01); *H01L 29/0847* (2013.01); *H01L 29/2003* (2013.01); *H01L 29/66462* (2013.01); *H01L 29/7787* (2013.01)

(58) Field of Classification Search
CPC ............ H01L 29/0847; H01L 29/2003; H01L 29/7786

USPC ........... 257/194, 192, 281, 195, 190, 609, 76; 438/167, 483, 791, 478, 758
See application file for complete search history.

(56) References Cited

U.S. PATENT DOCUMENTS 5,818,078 A * 10/1998 Makiyama et al. ........... 257/281
6,329,716 B1   12/2001 Nido et al.
7,968,390 B2 *  6/2011 Lahreche ..................... 438/167
(Continued)

FOREIGN PATENT DOCUMENTS

JP         2967743 B2    10/1999

OTHER PUBLICATIONS

International Search Report issued in PCT/JP2013/053549, dated Mar. 19, 2013.

*Primary Examiner* — Mohammed Shamsuzzaman
(74) *Attorney, Agent, or Firm* — Birch, Stewart, Kolasch & Birch, LLP (57) ABSTRACT

A nitride semiconductor device includes a substrate, a nitride semiconductor laminate, and an ohmic electrode of TiAl-based material. The nitride semiconductor laminate has a first nitride semiconductor layer on the substrate, and a second nitride semiconductor layer forming a heterointerface with the first nitride semiconductor layer. The nitride semiconductor device has an oxygen concentration profile in a depth direction of the device across between the ohmic electrode and the nitride semiconductor laminate. The profile has a first oxygen concentration peak near an interface between the ohmic electrode and the nitride semiconductor laminate in a region, of the nitride semiconductor laminate, that is on a substrate side of the interface, and a second oxygen concentration peak having an oxygen concentration of $3\times10^{17}$ cm$^{-3}$-$1.2\times10^{18}$ cm$^{-3}$ in a position deeper than that of the first oxygen concentration peak.

5 Claims, 9 Drawing Sheets

(56) References Cited

U.S. PATENT DOCUMENTS

| | | | |
|---|---|---|---|
| 8,405,126 B2* | 3/2013 | Shibata et al. | 257/195 |
| 8,969,917 B2* | 3/2015 | Morizuka et al. | 257/192 |
| 2008/0290371 A1* | 11/2008 | Sheppard et al. | 257/192 |
| 2010/0012977 A1* | 1/2010 | Derluyn et al. | 257/194 |
| 2011/0284865 A1* | 11/2011 | Inoue et al. | 257/76 |
| 2015/0076562 A1* | 3/2015 | Yasui et al. | 257/194 |

* cited by examiner

Fig.11 Comparative Example

NITRIDE SEMICONDUCTOR DEVICE

TECHNICAL FIELD

The present invention relates to nitride semiconductor devices.

BACKGROUND ART

There is a conventional nitride semiconductor device in which a surface of an n-type GaN contact layer has been subjected to oxygen plasma treatment to form an oxygen-doped layer at the surface thereof prior to formation of an ohmic electrode on the n-type GaN contact layer for the purpose of reducing the contact resistance between the ohmic electrode and the contact layer (see Japanese Patent No. 2967743 (PTL 1)).

However, as a result of experiments, done by the present inventors, in which an ohmic electrode was formed on a GaN layer after subjecting the GaN layer to the oxygen plasma treatment, contact resistances obtained of the ohmic electrode were found high. The inventors were not able to obtain a sufficiently reduced contact resistance.

CITATION LIST

Patent Literature

PTL 1: Japanese Patent No. 2967743

SUMMARY OF THE INVENTION

Technical Problem

An object of the present invention is to provide a nitride semiconductor device capable of reducing the contact resistance between an ohmic electrode and a nitride semiconductor layer.

Solution to Problem

The inventors have intensively studied on the contact resistances of ohmic electrodes formed on nitride semiconductor layers. As a result, the inventors have found that, when a first oxygen concentration peak and a second oxygen concentration peak occur in a region, of the nitride semiconductor layer, that is on a substrate side of an interface between the nitride semiconductor layer and the ohmic electrode, with the first oxygen concentration peak being located in vicinity of the interface and with the second oxygen concentration peak being deeper than the first oxygen concentration peak, properties of the contact resistance of the ohmic electrode with the nitride semiconductor layer vary according to the oxygen concentration at the second oxygen concentration peak.

Further, the present inventors have found for the first time through the experiments that the oxygen concentration at the second oxygen concentration peak, which is located on the substrate side of the interface, falls within a certain range, the contact resistance remarkably decreases.

Based on the above findings, the present invention provides a nitride semiconductor device which includes:

a substrate;

a nitride semiconductor laminate placed on the substrate and having a heterointerface;

an ohmic electrode comprising a TiAl-based material, at least a part of the ohmic electrode being placed on the nitride semiconductor laminate or in the nitride semiconductor laminate;

the nitride semiconductor laminate including a first nitride semiconductor layer placed on the substrate, and a second nitride semiconductor layer placed on the first nitride semiconductor layer and forming the heterointerface with the first nitride semiconductor layer; and an oxygen concentration profile in a depth direction of the nitride semiconductor device across between the ohmic electrode and the nitride semiconductor laminate, the oxygen concentration profile having:

a first oxygen concentration peak in a position in vicinity of an interface between the ohmic electrode and the nitride semiconductor laminate, the position of the first oxygen concentration peak being located in a region of the nitride semiconductor laminate that is on a substrate side of the interface between the ohmic electrode and the nitride semiconductor laminate, and a second oxygen concentration peak in a position deeper than the position of the first oxygen concentration peak, the second oxygen concentration peak having an oxygen concentration that is $3\times10^{17}$ cm$^{-3}$ or more but not more than $1.2\times10^{18}$ cm$^{-3}$.

The nitride semiconductor device according to the present invention has a reduced contact resistance between the nitride semiconductor laminate and the ohmic electrode due to the presence of the second oxygen concentration peak having the oxygen concentration of $3\times10^{17}$ cm$^{3}$ or more but not more than $1.2\times10^{18}$ cm$^{-3}$ in the position in the vicinity of the interface between the ohmic electrode and the nitride semiconductor laminate in the region, of the nitride semiconductor laminate, that is on the substrate side of that interface, i.e., the region being closer to the substrate than the interface is.

In one embodiment, the position of the second oxygen concentration peak is at a depth of 65 nm or more but not more than 110 nm from the interface between the ohmic electrode and the nitride semiconductor laminate.

In this embodiment, the contact resistance between the ohmic electrode and the nitride semiconductor laminate is reduced due to the presence of the second oxygen concentration peak at the depth of 65 nm or more but not more than 110 nm from the interface of the ohmic electrode and the nitride semiconductor laminate.

In one embodiment, the nitride semiconductor laminate has a recess that penetrates the second nitride semiconductor layer and reaches a two-dimensional electron gas layer in vicinity of the heterointerface, and the recess is filled with at least a part of the ohmic electrode.

In the embodiment, in the nitride semiconductor device of recessed structure, the contact resistance between the ohmic electrode and the two-dimensional electron gas layer, which is located in the vicinity of the heterointerface, is reduced.

Advantageous Effects of Invention

The nitride semiconductor device according to the present invention has a reduced contact resistance between the nitride semiconductor laminate and the ohmic electrode due to the presence of the second oxygen concentration peak having an oxygen concentration of $3\times10^{17}$ cm$^{-3}$ or more but not more than $1.2\times10$ in the vicinity of the interface between the ohmic electrode and the nitride semiconductor laminate in the region, of the nitride semiconductor laminate, that is on the substrate side of that interface.

DESCRIPTION OF THE EMBODIMENTS

Hereinbelow, the invention will be described in detail with reference to embodiments shown in the drawings.

Figure 1:
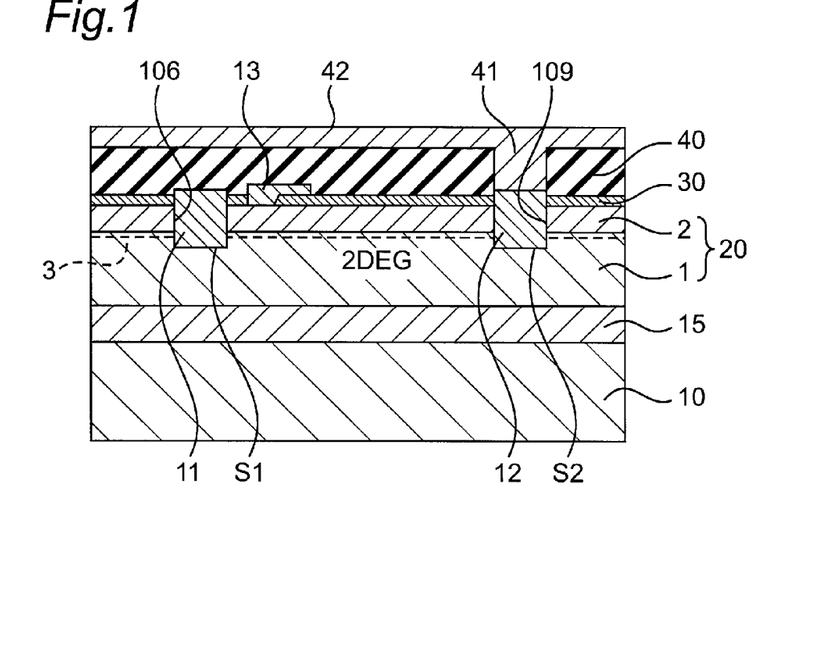
FIG. 1 is a cross-sectional view of a nitride semiconductor device according to an embodiment of the invention.

FIG. 1 shows a cross-sectional view of a nitride semiconductor device according to an embodiment of the present invention, which device is a GaN-based HFET (Hetero-junction Field Effect Transistor).

As shown in FIG. 1, this semiconductor device has a Si substrate 10, on which an undoped AlGaN buffer layer 15 and a nitride semiconductor laminate 20 are placed. The nitride semiconductor laminate 20 has an undoped GaN layer 1 as an example of the first nitride semiconductor layer, and an undoped AlGaN layer 2 as an example of the second nitride semiconductor layer. A two-dimensional electron gas layer (referred to also as "2DEG layer") 3 is generated in the vicinity of an interface between the undoped GaN layer 1 and the undoped AlGaN layer 2.

Instead of the GaN layer 1, an AlGaN layer, which has a composition providing a smaller band gap than that of the AlGaN layer 2, may be used. Further, a GaN layer having a thickness of about 1 nm may be provided as a cap layer on the AlGaN layer 2.

A source electrode 11 and a drain electrode 12 are provided in a spaced manner from each other in respective ones of recesses 106 and 109, which penetrate the AlGaN layer 2 and the 2DEG layer 3 into the GaN layer 1. Also, a gate electrode 13 is provided between the source electrode 11 and the drain electrode 12 and to the side of the source electrode 11. The source electrode 11 and the drain electrode 12 are ohmic electrodes and the gate electrode 13 is a Schottky electrode. The source electrode 11, the drain electrode 12, the gate electrode 13, and an active region of the GaN layer 1 and AlGaN layer 2, on which those three electrodes are formed, constitute a HFET.

The "active region" here refers to a region in the nitride semiconductor laminate 20 (a combination of the GaN layer 1 and the AlGaN layer 2) in which carriers are made to flow between the source electrode 11 and the drain electrode 12 by a voltage applied to the gate electrode 13 disposed between the source electrode 11 and the drain electrode 1.

An insulating film 30 made of $SiO_2$ is provided over the AlGaN layer 2, except regions where the source electrode 11, the drain electrode 12 and the gate electrode 13 are located, in order to protect the AlGaN layer 2. Also, an interlayer insulating film 40 made of polyimide is provided on the Si substrate 10 formed with the source electrode 11, the drain electrode 12, and the gate electrode 13. In FIG. 1, reference numeral 41 indicates a via serving as a contact portion, and 42 indicates a drain electrode pad. For the insulating film, materials of not only $SiO_2$ but also SiN and $Al_2O_3$ may be used. Preferably, the insulating film may have a multi-layer film structure of a non-stoichiometric SiN film and a SiO2 or SiN film. The non-stoichiometric SiN film, which is formed on a semiconductor surface, is intended for current collapse suppression and the SiO2 or SiN film is intended for surface protection. Also, the insulating material of the interlayer insulating film is not limited to polyimide, but may be $SiO_2$ made by the plasma CVD method, SOG (Spin on Glass), BPSG (Boron, Phosphorus, Silicate Glass), etc.

In the nitride semiconductor device having the above configuration, a channel is formed by the two-dimensional electron gas layer (2DEG layer) 3 generated in the vicinity of the interface between the GaN layer 1 and the AlGaN layer 2. The channel is controlled through application of a voltage to the gate electrode 13 to thereby turn on and off the HFET having the source electrode 11, the drain electrode 12, and the gate electrode 13. The HFET is a normally on type transistor. That is, when a negative voltage is applied to the gate electrode 13, a depletion layer is formed in the GaN layer 1 below the gate electrode 13 and the HFET turns off. On the other hand, while the gate electrode is at zero volts, the depletion layer below the gate electrode 13 is not present so that the HFET is in an on state.

Next, a method of making the nitride semiconductor device will be described below with reference to FIGS. 2-5. It should be noted that the Si substrate and the undoped AlGaN buffer layer are not shown in FIGS. 2-5 and the size of the source and drain electrodes and the spacing therebetween have been modified for the sake of simplification and clarity.

Figure 2:
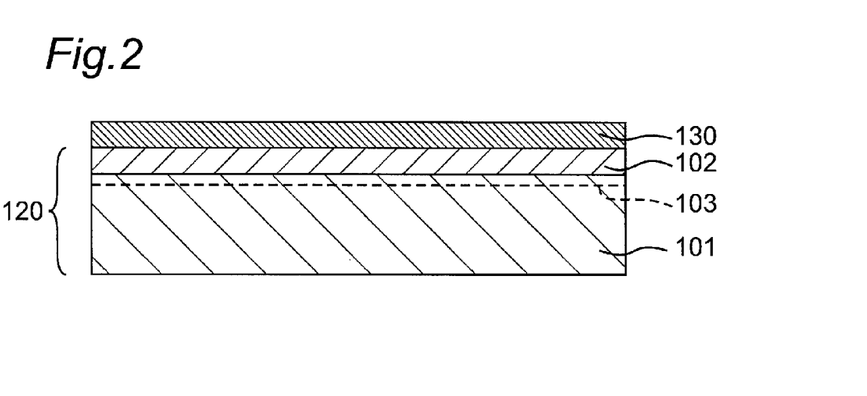
FIG. 2 is a sectional view showing a process step for making the nitride semiconductor device.

First, as shown in FIG. 2, an undoped AlGaN buffer layer (not shown), an undoped GaN 101 and an undoped AlGaN layer 102 are formed in order on a Si substrate (not shown) by the MOCVD (Metal Organic Chemical Vapor Deposition) method. The thickness of the undoped GaN layer 101 is, for example, 1 μm, and that of the undoped AlGaN layer 102 is, for example, 30 nm. The GaN layer 101 and the AlGaN layer 102 constitute a nitride semiconductor laminate 120.

Next, an insulating film (e.g., $SiO_2$) 130 is formed to a thickness of 200 nm on the AlGaN layer 102 by, for example, the plasma CVD (Chemical Vapor Deposition) method. In FIG. 2, reference numeral 103 indicates a two-dimensional electron gas layer (2DEG) to be formed in vicinity of a heterointerface between the GaN layer 101 and the AlGaN layer 102.

Figure 3:
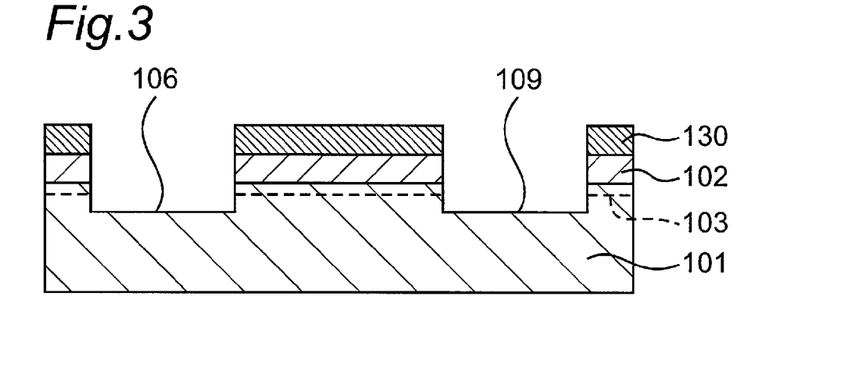
FIG. 3 is a sectional view showing a process step following the process step of FIG. 2.

Then, a photoresist (not shown) is applied over the insulating film 130 and patterned. After the patterning, portions to form ohmic electrodes in are removed from the photoresist by dry etching, as shown in FIG. 3. In this way, recesses 106, 109 are formed, which penetrate the AlGaN layer 102 into an upper part of the GaN layer 101 and thus are deeper than the 2DEG layer 103. The dry etching process uses a chlorine-based gas. The depth of the recesses 106 and 109 should be equal to or larger than a distance from a top surface of the AlGaN layer 102 to the 2DEG layer 103, and is, for example, 50 nm.

Further, in the dry etching process, this embodiment uses a RIE (reactive ion etching) device whose self-bias voltage Vdc is set at not lower than 180 V, but not higher than 240 V.

Next, an $O_2$ plasma treatment, washing with $HCl/H_2O_2$, and washing with BHF (buffered hydrofluoric acid) or 1% HF (hydrofluoric acid) are performed sequentially. Then, annealing is performed (at 500° C.-850° C. for example) to reduce damages due to the dry etching.

Figure 4:
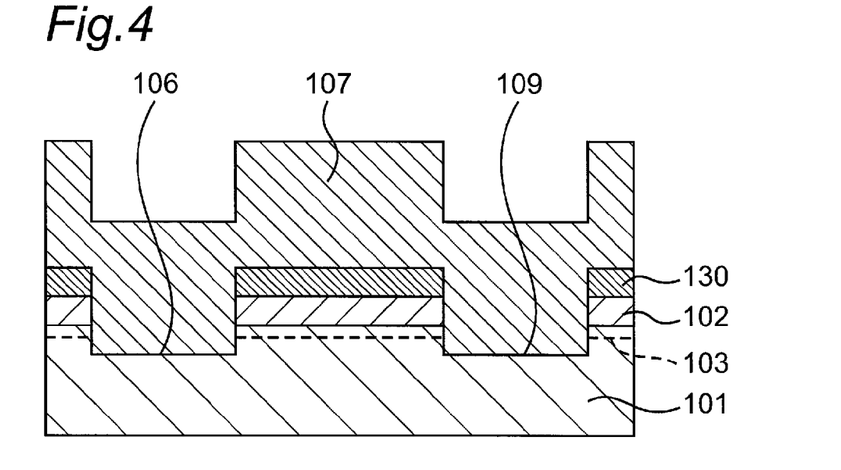
FIG. 4 is a sectional view showing a process step following the process step of FIG. 3.

Next, as shown in FIG. 4, Ti, Al, and TiN layers are deposited sequentially by sputtering over the insulating film 130 and in the recesses 106 and 109 to form a laminated metal film 107 of the Ti/Al/TiN layers, which will eventually serve as ohmic electrodes. Here, the TiN layer is a cap layer for protecting the Ti/Al layers from the subsequent steps.

When forming the laminated metal film 107 by sputtering, a small amount of oxygen is introduced (at 5 sccm, for example) into a chamber during deposition of the Ti layer. The flow rate of the oxygen here should be small enough to prevent a Ti oxide from being produced. Instead of a small amount of oxygen flowing in the chamber during the deposition of the Ti layer, oxygen may be introduced in the chamber at 50 sccm for five minutes prior to the deposition of the Ti layer.

In the above sputtering process, Ti and Al may be sputter-deposited at the same time. Instead of sputtering, Ti and Al may be deposited by evaporation.

Figure 5:
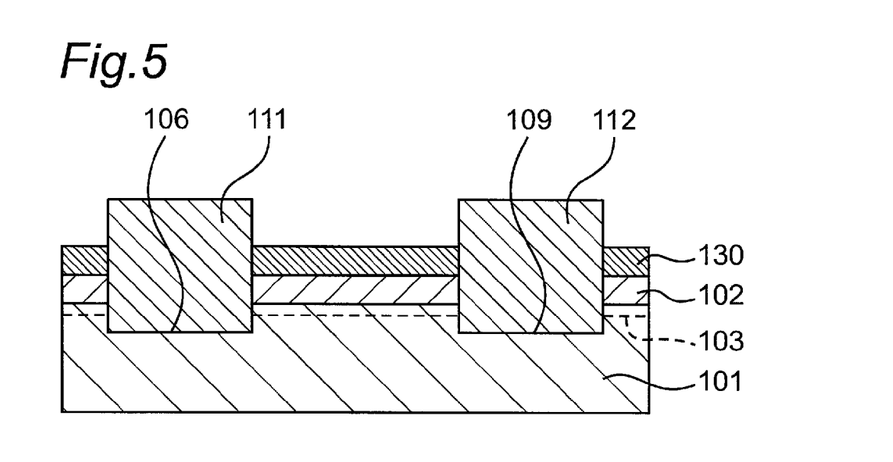
FIG. 5 is a sectional view showing a process step following the process step of FIG. 4.

Next, as shown in FIG. 5, patterning of the ohmic electrodes 111 and 112 is performed by ordinary photolithography and dry etching.

Then, the substrate formed with the ohmic electrodes 111 and 112 is annealed at a temperature as low as 400° C.-500° C., inclusive, for 10 minutes or more. As a result, ohmic contacts are obtained between the two-dimensional electron gas layer (2DEG layer) and the ohmic electrodes 111 and 112. In this way, a largely reduced contact resistance is obtainable, compared with a case in which the annealing is performed at a higher temperature exceeding 500° C. The annealing at a temperature as low as 400° C.-500° C., inclusive, also suppresses diffusion of electrode metals into the insulating film 130, thereby preventing properties of the insulating film from being adversely affected. Furthermore, the annealing at such a low temperature prevents current collapse due to removal of nitrogen from the GaN layer 101, and variation in the properties from occurring. The "current collapse" refers to a phenomenon in which the ON resistance of a transistor in a high voltage operation becomes higher than the ON resistance of the transistor in a low voltage operation.

The ohmic electrodes 111 and 112 will eventually serve as the source electrode 11 and the drain electrode 12. In a later step a gate electrode of TiN or WN is formed between the ohmic electrodes 111 and 112.

The method of making the nitride semiconductor device according to the present embodiment allows to obtain an oxygen concentration profile in a depth direction of the nitride semiconductor device from the source and drain electrodes 11 and 12 to the GaN layer 1, which oxygen concentration profile has a first oxygen concentration peak P1 in the undoped GaN layer 1 in the vicinity of interfaces S1 and S2 between the undoped GaN layer 1 and the source and drain electrodes 11 and 12. Further, the oxygen concentration profile has a second oxygen concentration peak P2 in a position deeper than that of the first oxygen concentration peak P1. The above method can make it possible to obtain an oxygen concentration of $3 \times 10^{17}$ cm$^{-3}$ or more, but not more than $1.2 \times 10^{18}$ cm$^{-3}$ at the second oxygen concentration peak P2. The first oxygen concentration peak P1 has an oxygen concentration higher than that of the second oxygen concentration peak P2. The oxygen concentration of the first oxygen concentration peak P1 may be, for example, $1 \times 10^{18}$ cm$^{-3}$ or more but not more than $7 \times 10^{18}$ cm$^{-3}$.

Figure 6:
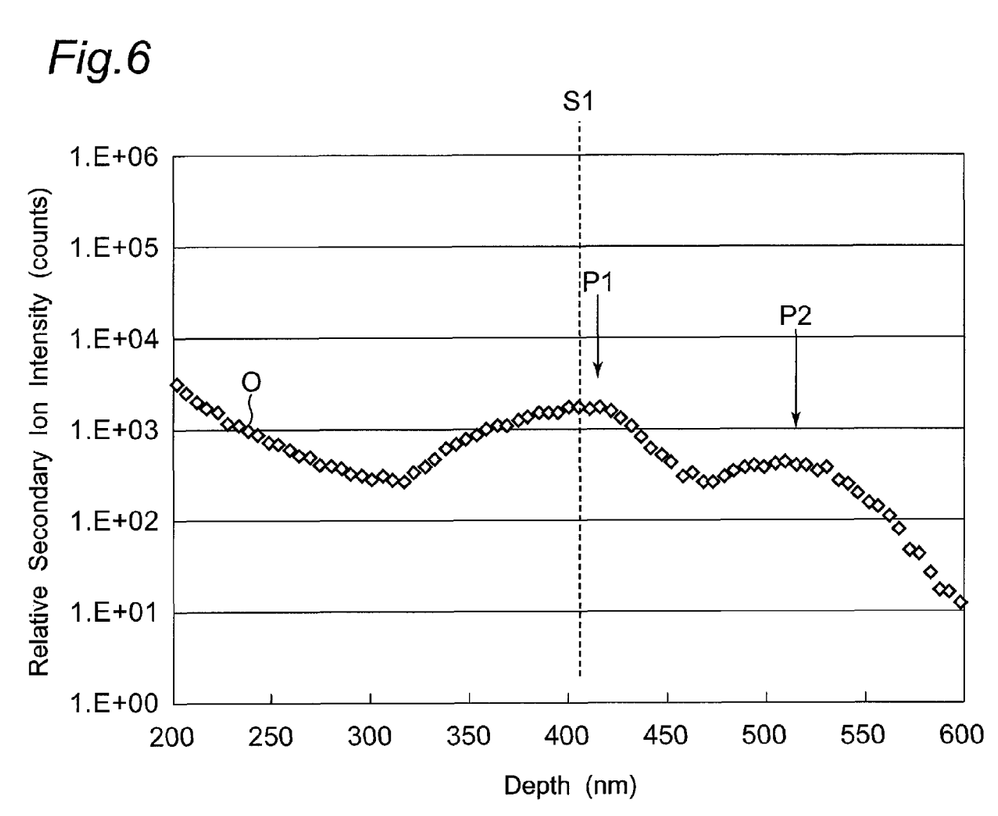
FIG. 6 is a graph showing an oxygen concentration profile in a depth direction of the device across an interface between an ohmic electrode and a CaN layer.

FIG. 6 is a graph showing an example of the oxygen concentration profile in the depth direction of the device across the interface S1 between the source electrode 11 and the undoped GaN layer 1. In FIG. 6, indications of 1.E+00, 1.E+01, . . . 1.E+06 on the vertical axis represent 1.0, 1.0×10, . . . $1.0 \times 10^6$, respectively. This graph shows results of measurements by SIMS (secondary ion mass spectroscopy) using a TEG (test element group). In this graph, the depth (nm) is plotted on the horizontal axis and the relative secondary ion intensity (counts) is plotted on the vertical axis. FIG. 6 shows a case, by way of example, in which the first oxygen concentration peak P1 is located in the GaN layer 1 and at a depth of about 8 nm from the interface S1, and the second oxygen concentration peak P2 is located in the GaN layer 1 and at a depth of about 108 nm from the interface S1. In the example shown in FIG. 6, the second oxygen concentration peak P2 had an oxygen concentration of about $8 \times 10^{17}$ cm$^{-3}$ and the contact resistance between the ohmic electrode (source electrode 11) and the GaN layer 1 was 1.4 Ωmm.

The interface S1 corresponds to a position of a peak of a relative secondary ion intensity (counts) of carbon C. An oxygen concentration profile similar to the oxygen concentration profile shown in the graph of FIG. 6 was obtained in the depth direction of the device across the interface S2 between the drain electrode 12 and the undoped GaN layer 1, and a contact resistance between the ohmic electrode (drain electrode 12) and the GaN layer 1 of 1.4 Ωmm was also obtained.

Figure 7:
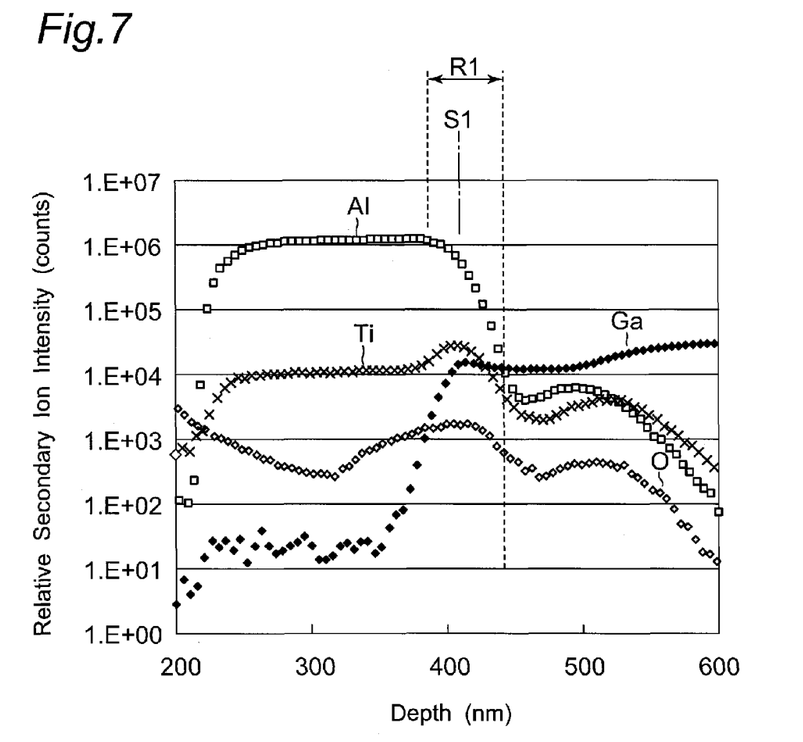
FIG. 7 is a graph showing concentration profiles of oxygen, Al, Ti, and Ga in a depth direction of the device across an interface between an ohmic electrode and a GaN layer.

FIG. 7 is a graph showing an oxygen concentration profile and also Al, Ti, and Ga concentration profiles in the depth direction of the device across the interface S1 between the source electrode 11 and the undoped GaN layer 1. In FIG. 7, indications of 1.E+00, 1.E+01, . . . 1.E+07 on the vertical axis represent 1.0, 1.0×10, . . . $1.0 \times 10^7$, respectively. The graph of FIG. 7 shows results of measurements by the SIMS (secondary ion mass spectroscopy) using a TEG (test element group). In this graph, the depth (nm) is plotted on the horizontal axis and the relative secondary ion intensity (counts) is plotted on the vertical axis, as does FIG. 6. FIG. 7 shows a case, by way of example, in which a region ranging from a depth of about 378 nm to a depth of about 438 nm is a "region R1 in the vicinity of the interface". That is, the region R1 in the vicinity of the interface consists of a region extending from the interface S1 toward a shallower side (i.e., upward) by about 27 nm and a region extending from the interface S1 toward a deeper side (i.e., downward) by about 33 nm.

Al, Ti, and Ga concentration profiles in the depth direction of the device across the interface S2 between the drain electrode 12 and the undoped GaN layer 1 were similar to those shown in the graph of FIG. 7.

Figure 8:
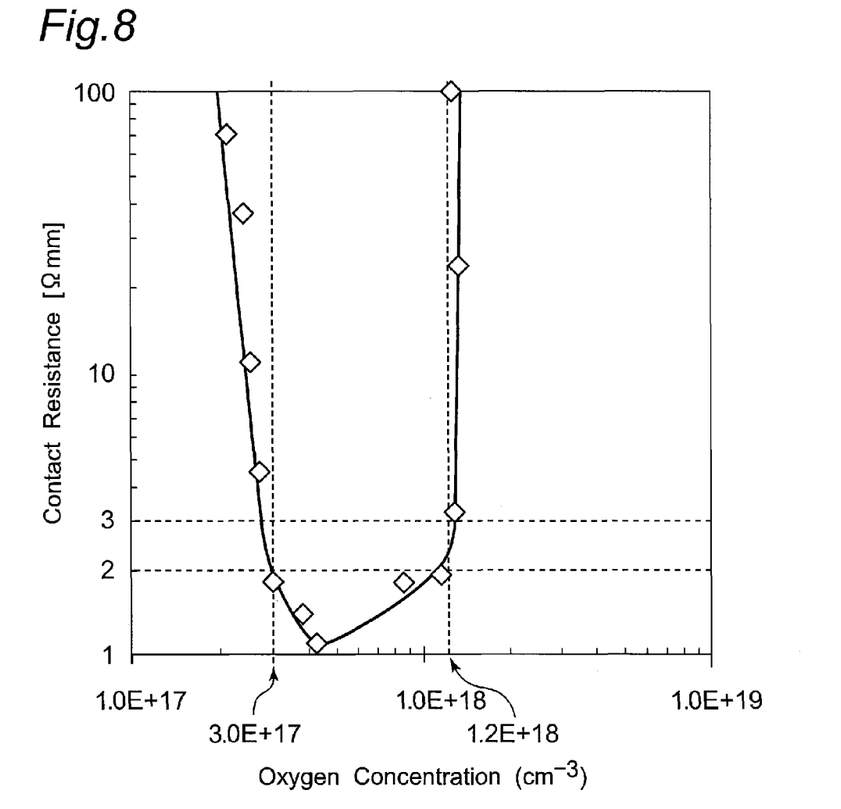
FIG. 8 is a graph showing relationship between the oxygen concentration in $cm^{-3}$ at a second oxygen concentration peak P2 and the contact resistance of a source/drain electrode in the embodiment.

FIG. 8 shows relationship between the oxygen concentration in cm$^{-3}$ at the second oxygen concentration peak P2 and the contact resistance in Ωmm between the source and drain electrodes 11 and 12 and the 2DEG layer 3 of the nitride semiconductor laminate 20. In FIG. 8, indications of E+17, E+18, and E+19 on the horizontal axis represent $\times 10^{17}$, $\times 10^{18}$, and $\times 10^{19}$, respectively.

As is apparent from FIG. 8, the contact resistance can be reduced to about 2 Ωmm or less by making the oxygen concentration at the second oxygen concentration peak P2 fall in the range of from $3 \times 10^{17}$ cm$^{-3}$ to $1.2 \times 10^{18}$ cm$^{-3}$, inclusive.

On the other hand, when the oxygen concentration of the second oxygen concentration peak P2 was below $3 \times 10^{17}$ cm$^{-3}$, the contact resistance was largely increased. A possible reason for this is that the excessively low oxygen concentration of the second oxygen concentration peak P2 lead to insufficiency of activation of oxygen, which is a reaction required to occur in the GaN layer for establishment of ohmic contacts. Further, when the oxygen concentration of the second oxygen concentration peak P2 exceeded $1.2 \times 10^{18}$ cm$^{-3}$, the contact resistance was also largely increased. A possible reason for this is that the excessively high oxygen concentration of the second oxygen concentration peak P2 lead to an reaction of the excessive oxygen with Ti, which in turn caused insufficiency of removal of N (nitrogen) out of GaN by means of Ti, which is also a reaction, in the GaN layer 1, required for establishment of ohmic contacts.

That is, it is believed that according to the present embodiment, setting the oxygen concentration of the second oxygen concentration peak P2 in the range of from $3 \times 10^{17}$ cm$^{-3}$ to $1.2 \times 10^{18}$ cm$^{-3}$, inclusive, facilitates both activation of oxygen in the GaN layer and removal of N from the GaN, which both are reactions required for establishment or formation of ohmic contacts, with the result that an ohmic contact of a resistance as low as about 2 Ωmm or less is obtainable.

Figure 11:
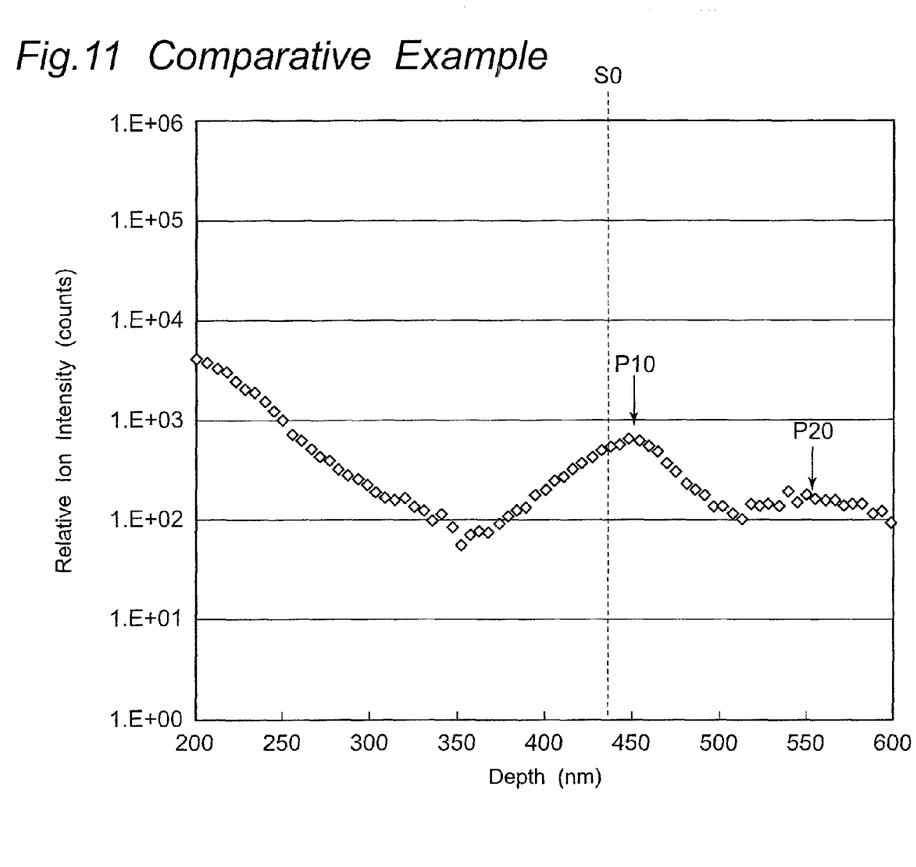
FIG. 11 is a graph showing an oxygen concentration profile in a depth direction of a device across an interface between an ohmic electrode and a GaN layer in a comparative example.

FIG. 11 is a graph showing an oxygen concentration profile in a depth direction of a device across an interface S0 between an ohmic electrode (a source/drain electrode) and an undoped GaN layer in a comparative example to be compared with the nitride semiconductor device (GaN-based HFET) of the above embodiment. In FIG. 11, indications of 1.E+00, 1.E+01, ... 1.E+06 on the vertical axis represent 1.0, 1.0×10, ... 1.0×10$^{6}$, respectively. The device of this comparative example has a sectional structure similar to that of the device of the embodiment shown in FIG. 1, but is different in the oxygen concentration profile from the device of the embodiment.

The graph of FIG. 11 shows results of measurements by the SIMS (secondary ion mass spectroscopy) using a TEG (test element group). In this graph, the depth (nm) is plotted on the horizontal axis and the relative secondary ion intensity (counts) is plotted on the vertical axis. FIG. 11 shows that a first oxygen concentration peak P10 is located in the GaN layer and at a depth of about 15 nm from the interface S0, and a second oxygen concentration peak P20 is located in the GaN layer and at a depth of about 115 nm from the interface S0. In the comparative example, the second oxygen concentration peak P20 had an oxygen concentration of about $2.0 \times 10^{17}$ cm$^{-3}$, which is lower than $3 \times 10^{17}$ cm$^{-3}$, indicating that the second oxygen concentration peak P20 is almost not a peak. Therefore, the comparative example had a contact resistance of the ohmic electrode of as high as 70 Ωmm, which is very much larger than the contact resistance (less than about 2 Ωmm) of the ohmic electrode of the embodiment.

Figure 9:
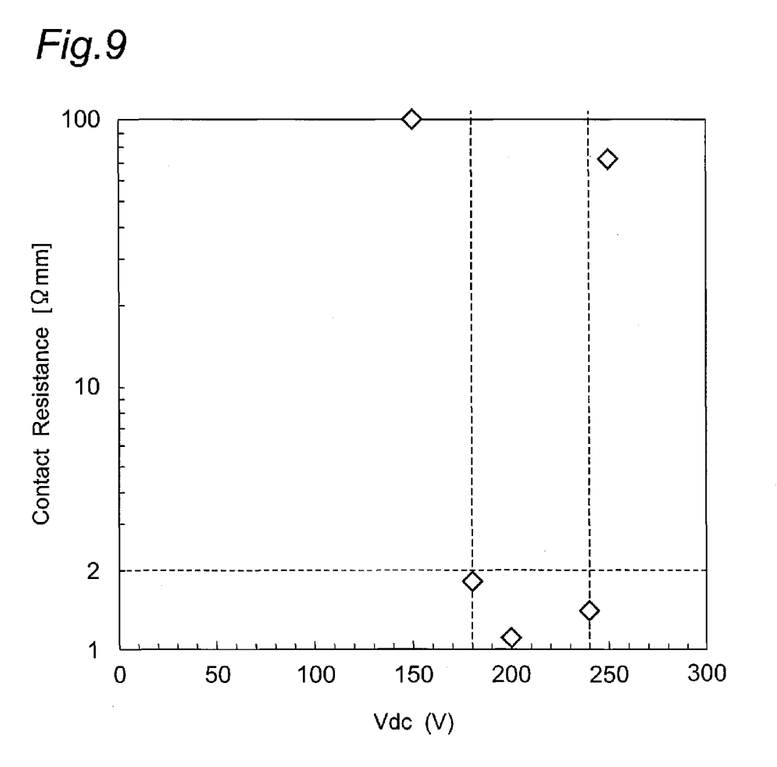
FIG. 9 is a graph showing relationship between the self-bias voltage Vdc applied during a dry etching process of the device making process of the embodiment and the contact resistance of the source/drain electrode.

The following will describe relationship between the self-bias voltage Vdc of a RIE device used during a dry etching process to form the recesses 106 and 109, and the contact resistance (mm) of the source/drain electrode 11, 12, referring to FIG. 9. As can be understood from FIG. 9, setting the self-bias voltage Vdc in the dry etching process at 180 V or more but not more than 240 V allows the contact resistances of the source electrode 11 and the drain electrode 12 to be less than 2 Ωmm.

On the other hand, when the self-bias voltage Vdc was below 180 V, the contact resistance was largely increased. A possible reason for this is that the excessively small self-bias voltage Vdc lead to an excessively low oxygen concentration at the second oxygen concentration peak P2 (namely, lower than $3 \times 10^{17}$ cm$^{-3}$) or even to the absence of the second oxygen concentration peak P2. As described above, it is believed that too low an oxygen concentration of the second oxygen concentration peak P2 causes insufficiency of the activation of oxygen that is a reaction required to occur in the GaN layer for establishment of the ohmic contacts.

Further, when the self-bias voltage Vdc was higher than 240 V, the contact resistance was also largely increased. A possible reason for this is that the excessively large self-bias voltage Vdc caused very deep damages in the GaN layer 1, resulting in the excessively high oxygen concentration at the second oxygen concentration peak P2 (namely, higher than $1.2 \times 10^{18}$ cm$^{-3}$). As described above, it is believed that too high an oxygen concentration of the second oxygen concentration peak P2 causes insufficiency of the removal of N from GaN by means of Ti, which is a reaction required to occur in the GaN layer 1 for establishment of the ohmic contacts.

Figure 10:
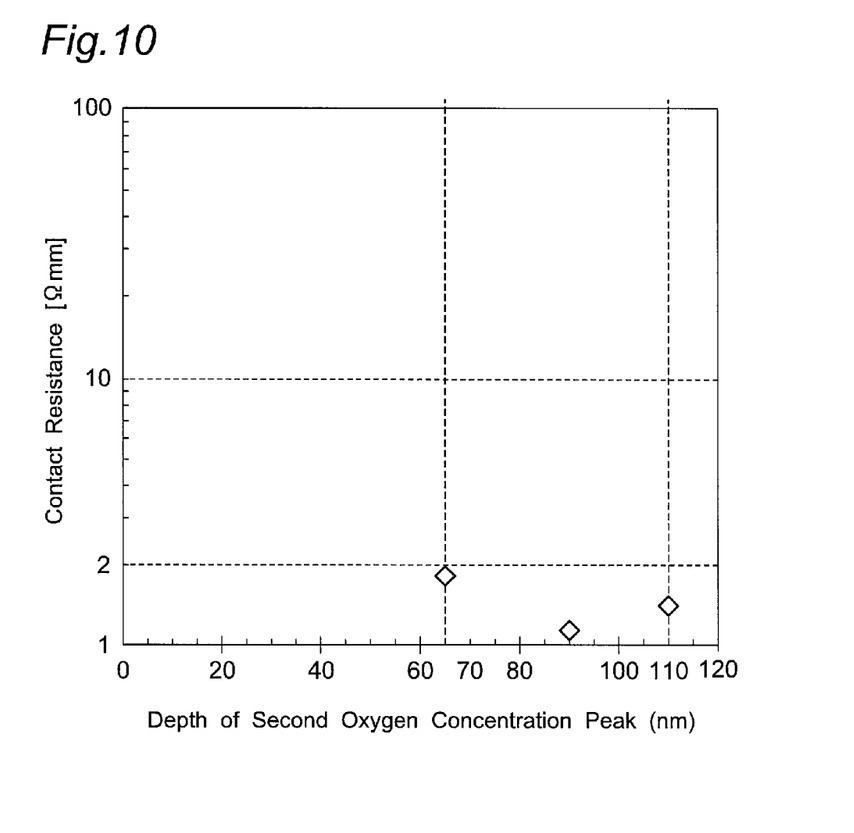
FIG. 10 is a graph showing relationship between the depth of the second oxygen concentration peak P2 and the contact resistance of the source/drain electrode in the embodiment.

FIG. 10 shows relationship between the depth (nm) of the second oxygen concentration peak P2 from the interface S1 and the contact resistance (Ωmm) of the source and drain electrodes 11 and 12. It can be understood from FIG. 10 that if the second oxygen concentration peak P2 is located at a depth of from 65 nm to 110 nm, inclusive, from the interface S1, the contact resistance can be decreased to 2 Ωmm or less. On the other hand, if the depth from the interface S1 of the second oxygen concentration peak P2 is less than 65 nm, the second oxygen concentration peak P2 is not clearly distinguishable from the first oxygen concentration peak P1. Further, if the depth from the interface S1 of the second oxygen concentration peak P2 is more than 110 nm, the second oxygen concentration peak P2 will hardly be present.

The making method according to the above embodiment allows the oxygen concentration at the second oxygen concentration peak P2 to fall in the range of from $3 \times 10^{17}$ cm$^{-3}$ to $1.2 \times 10^{18}$ cm$^{-3}$, inclusive. Also, the method can make the second oxygen concentration peak P2 located at a depth of from 65 nm to 110 nm, inclusive, (for example, 108 nm) from the interface S1 so that the contact resistance is reduced to 2 Ωmm or less.

It is believed that due to the depth of the second oxygen concentration peak P2 from the interface S1 falling in the range of from 65 nm to 110 nm, inclusive, a depth at which reactions necessary for establishment of ohmic contacts occur at low temperatures (400° C.-500° C. for the annealing process) is optimized, resulting in that the ohmic contact establishing reactions are facilitated.

In the above-described method of making the nitride semiconductor device of the embodiment, parts of the insulating film 130, the AlGaN layer 102, and the GaN layer 101 are removed by dry etching to form the recesses 106 and 109. Alternatively, parts of the insulating film 130 may be first removed by wet etching and then parts of the AlGaN layer 102 and GaN layer 101 are removed to finally form the recesses 106 and 109.

Also, in the above-described method of making the nitride semiconductor device of the embodiment, layers of Ti/Al/TiN are stacked to form the ohmic electrodes. However, the TiN may be omitted. Also, layers of Au, Ag, and/or Pt may be stacked on the Ti/Al layers.

The above embodiment has been described in connection with the nitride semiconductor device that uses a Si substrate. The present invention is, however, not limited to such a device using a Si substrate, but other substrates such as a sapphire substrate, a SiC substrate, for example, may be used, so that nitride semiconductor is grown on the sapphire substrate, the SiC substrate, etc. Also, nitride semiconductor may be grown on a nitride semiconductor substrate; for example, an AlGaN layer may be grown on a GaN substrate. In addition, a buffer layer may be formed between the substrate and the nitride semiconductor laminate. Also, a hetero-improving layer may be formed between the first and second nitride semiconductor layers of the nitride semiconductor laminate.

The above embodiment has been described in connection with the recess-structured HFET in which the ohmic electrodes reach the GaN layer. The present invention is, however, also applicable to HFETs in which ohmic electrodes serving as source and drain electrodes are formed on an undoped AlGaN layer having no recesses. Also, effects of the present invention are similarly obtainable not only from HFETs utilizing the 2DEG but also from otherwise-structured field effect transistors.

The above embodiment has been described in connection with the normally on type HFET. The present invention is, however, also applicable to normally off type nitride semiconductor devices. Also, the present invention is not limited to nitride semiconductor devices having a gate electrode being a Schottky electrode, but also applicable to field effect transistors having insulated-gate structure as well.

Any nitride semiconductors that have a composition expressed as $Al_xIn_yGa_{1-x-y}$ ($x\leq0$, $y\leq0$, $0\leq x+y\leq1$) may be used for the nitride semiconductor device of the present invention include.

Although specific embodiments of the present invention have been described above, it should be understood that those embodiments are not limitative, but can be changed or modified in various ways within the scope of the invention.

REFERENCE SIGNS LIST 1, 101 GaN layer
2, 102 AlGaN layer
3, 103 2DEG layer
Si substrate
11 source electrode
12 drain electrode
13 gate electrode
15 AlGaN buffer layer
20, 120 nitride semiconductor laminate
30, 130 insulating film
40 interlayer insulating film
41 via
42 drain electrode pad
106, 109 recess
111, 112 ohmic electrode
P1 first oxygen concentration peak
P2 second oxygen concentration peak
S1 interface

What is claimed is:

1. A nitride semiconductor device comprising:
a substrate;
a nitride semiconductor laminate placed on the substrate and having a heterointerface;
an insulating film serving as a protection layer on the nitride semiconductor laminate;
an ohmic electrode comprising a TiAl-based material, a part of the ohmic electrode being placed in the nitride semiconductor laminate;
the nitride semiconductor laminate including a first nitride semiconductor layer placed on the substrate, and a second nitride semiconductor layer placed on the first nitride semiconductor layer and forming the heterointerface with the first nitride semiconductor layer; and
an oxygen concentration profile in a depth direction of the nitride semiconductor device across an interface between the ohmic electrode and the nitride semiconductor laminate, the oxygen concentration profile having:
a first oxygen concentration peak in a position in vicinity of the interface between the ohmic electrode and the nitride semiconductor laminate, the position of the first oxygen concentration peak being located in a region of the nitride semiconductor laminate that is on a substrate side of the interface between the ohmic electrode and the nitride semiconductor laminate, and
a second oxygen concentration peak in a position deeper than the position of the first oxygen concentration peak, the second oxygen concentration peak having an oxygen concentration that is $3\times10^{17}$ cm$^{-3}$ or more but not more than $1.2\times10^{18}$ cm$^{-3}$,
wherein the position of the second oxygen concentration peak is at a depth of 65 nm or more but not more than 110 nm from the interface between the ohmic electrode and the nitride semiconductor laminate.

2. The nitride semiconductor device according to claim 1, wherein the nitride semiconductor laminate has a recess that penetrates the second nitride semiconductor layer and reaches a two dimensional electron gas layer in vicinity of the heterointerface, and the recess is filled with the part of the ohmic electrode.

3. The nitride semiconductor device according to claim 1, wherein
the first nitride semiconductor layer includes a two dimensional electron gas layer near the heterointerface between the first nitride semiconductor layer and the second nitride semiconductor layer, and
the part of the ohmic electrode extends in the first nitride semiconductor to a position deeper than the two dimensional electron gas layer.

4. The nitride semiconductor device according to claim 2, wherein the recess also penetrates the insulating film as well.

5. The nitride semiconductor device according to claim 1, wherein the first and second oxygen concentration peaks are peaks obtained from SIMS measurement results.

* * * * *